(12) United States Patent
Wenham et al.

(10) Patent No.: US 10,461,212 B2
(45) Date of Patent: Oct. 29, 2019

(54) METHOD FOR PROCESSING SILICON MATERIAL

(71) Applicant: NewSouth Innovations Pty Limited, Sydney, New South Wales (AU)

(72) Inventors: Stuart Ross Wenham, Cronulla (AU); Alison Ciesla, Cronulla (AU); Brett Jason Hallam, Bexley (AU); Catherine Emily Chan, Kensington (AU); Chee Mun Chong, Bellevue Hill (AU); Ran Chen, Botany (AU); Malcolm David Abbott, Naremburn (AU); David Neil Payne, Kensington (AU)

(73) Assignee: NewSouth Innovations Pty Limited, Sydney, New South Wales (AU)

( * ) Notice: Subject to any disclaimer, the term of this patent is extended or adjusted under 35 U.S.C. 154(b) by 0 days.

(21) Appl. No.: 16/307,562

(22) PCT Filed: Jun. 6, 2017

(86) PCT No.: PCT/AU2017/050560
§ 371 (c)(1),
(2) Date: Dec. 6, 2018

(87) PCT Pub. No.: WO2017/210731
PCT Pub. Date: Dec. 14, 2017

(65) Prior Publication Data
US 2019/0252572 A1    Aug. 15, 2019

(30) Foreign Application Priority Data

Jun. 6, 2016 (AU) .............................. 2016902198

(51) Int. Cl.
*H01L 31/0224* (2006.01)
*H01L 31/18* (2006.01)
*H01L 31/068* (2012.01)

(52) U.S. Cl.
CPC .. *H01L 31/1864* (2013.01); *H01L 31/022425* (2013.01); *H01L 31/068* (2013.01); *H01L 31/1804* (2013.01); *H01L 31/1868* (2013.01)

(58) Field of Classification Search
CPC ......... H01L 31/1864; H01L 31/022425; H01L 31/068; H01L 31/1804; H01L 31/1868
See application file for complete search history.

(56) References Cited

U.S. PATENT DOCUMENTS

| 2008/0075840 A1 | 3/2008 | Enjalbert et al. |
| 2009/0253225 A1 | 11/2009 | Dubois et al. |
| 2015/0357510 A1 | 12/2015 | Lee et al. |

FOREIGN PATENT DOCUMENTS

WO    2013173867    11/2013

OTHER PUBLICATIONS

International Search Report for Application No. PCT/AU2017/050560 dated Aug. 25, 2017 (6 pages).

(Continued)

*Primary Examiner* — Elias Ullah
(74) *Attorney, Agent, or Firm* — Michael Best & Friedrich LLP

(57) ABSTRACT

The present disclosure provides methods for manufacturing a photovoltaic device that comprise a sequence of annealing steps and exposure to electromagnetic radiation during annealing that allow passivating electrically active defects and stabilising the performance of photovoltaic device.

20 Claims, 7 Drawing Sheets

(56) References Cited

OTHER PUBLICATIONS

Yang, L. et al., "Investigating the Effect of Thermal Annealing Process on the Photovoltaic Performance of the Graphene-Silicon Solar Cell," 2015, International Journal of Photoenergy, pp. 1-6.

METHOD FOR PROCESSING SILICON MATERIAL

FIELD OF THE INVENTION

The present invention generally relates to methods for manufacturing photovoltaic devices and methods for stabilising the performance of photovoltaic devices.

BACKGROUND OF THE INVENTION

Silicon is the main semiconductor material used to fabricate today's commercial solar cells. The majority of commercial solar cells are fabricated from a monocrystalline or multi-crystalline silicon wafer. A p-n junction is formed in the silicon wafer by, for example, diffusing n-type atoms into a p-type silicon wafer.

A large proportion of solar cells are fabricated using a boron-doped wafer (p-type). Generally, the performance of a solar cell degrades when it is exposed to radiation or more broadly, subject to carrier injection. These phenomena are known in the art as Light Induced Degradation (LID) and Carrier Induced Degradation (CID).

In the photovoltaic industry, Passivated Emitter Rear Contact (PERC) solar cells are becoming increasingly popular because they deliver good potential for high-volume manufacturing at low cost and increased efficiency compared to conventional technologies. PERC solar cells are largely fabricated using multi-crystalline silicon (mc-Si) wafers. In the case of mc-Si wafers, the lifetime of charge carriers degrades significantly over long time scales due to CID. CID reduces the efficiency of PERC solar cells and it is known to occur much faster with increasing illumination intensities or at elevated temperatures.

Methods have been proposed to mitigate the detrimental effects of CID on solar cells. For example, it has been reported that eliminating the contact firing step during manufacturing largely reduces the effects of CID on cell performance. However, the solutions proposed are either not compatible with cell manufacturing processes, or provide limited improvement. For example, during the fabrication of screen printed mc-Si PERC solar cells, a firing temperature of 800° C. is commonly used in the art to form the silver-screen printed contacts.

There is a need in the art for a manufacturing process which is capable of stabilising the solar cells by substantially reducing the effect of CID on cell performance.

SUMMARY OF THE INVENTION

In accordance with the first aspect, the present invention provides a method for manufacturing a photovoltaic device, the method comprising the steps of:
- providing a substrate that comprises a silicon p-n junction;
- annealing the substrate at a temperature between 500° C. and 700° C. in the presence of a hydrogen source for a first predetermined period of time to allow hydrogen atoms to penetrate into silicon material of the silicon p-n junction; and
- exposing the substrate to electromagnetic radiation while the substrate is kept at a temperature between 150° C. and 400° C. in a manner such that photons with an energy higher than that of a bandgap of the silicon material are provided at a radiation intensity of at least 20 mW/cm$^2$ and an excess of minority carriers is created in the silicon material;
- wherein, during the steps of annealing the substrate and exposing the substrate to electromagnetic radiation, electrically active defects in the silicon material are passivated.

In accordance with the second aspect, the present invention provides a method for manufacturing a photovoltaic device, the method comprising the steps of:
- providing a substrate that comprises a silicon p-n junction;
- annealing the substrate at a temperature between 300° C. and 700° C. in the presence of a hydrogen source for a first predetermined period of time to allow hydrogen atoms to penetrate into silicon material of the p-n junction;
- exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm$^2$ and an excess of minority carriers is created in the silicon material; and
- further annealing the substrate at a temperature between 200° C. and 500° C. for a second predetermined period of time to reduce contact resistance between the metallic electrodes and the silicon material;
- wherein, during the steps of annealing the substrate and exposing the substrate to electromagnetic radiation, electrically active defects in the silicon material are passivated.

In embodiments, the first period of time is between 1 second and 5 minutes.

In accordance with the third aspect, the present invention provides a method for manufacturing a photovoltaic device, the method comprising the steps of:
- providing a substrate that comprises a silicon p-n junction;
- annealing the substrate at a temperature between 700° C. and 900° C. in the presence of a hydrogen source for a first predetermined period of time to allow hydrogen atoms to penetrate into silicon material of the silicon p-n junction;
- annealing the substrate at a temperature between 600° C. and 700° C. for a further predetermined period of time; and
- exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm$^2$ and an excess of minority carriers is created in the silicon material;
- wherein, during the steps of annealing the substrate and exposing the substrate to electromagnetic radiation, electrically active defects in the silicon material are passivated.

In accordance with the fourth aspect, the present invention provides a method for manufacturing a photovoltaic device, the method comprising the steps of:
- providing a substrate that comprises a silicon p-n junction;
- annealing the substrate at a temperature between 700° C. and 900° C. in the presence of a hydrogen source for a first predetermined period of time to allow hydrogen atoms to penetrate into silicon material of the p-n junction;

annealing the substrate at a temperature between 250° C. and 700° C. for a further predetermined period of time; and exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm² and an excess of minority carriers is created in the silicon material;

further annealing the substrate at a temperature between 200° C. and 500° C. for a second predetermined period of time to reduce contact resistance between the metallic electrodes and the silicon material;

wherein, during the steps of annealing the substrate and exposing the substrate to electromagnetic radiation, electrically active defects in the silicon material are passivated.

In embodiments, the first period of time is between 1 second and 5 seconds.

In embodiments, the method further comprises the step of forming a plurality of metallic electrodes on a surface of the substrate. The metallic electrodes may be fired during the step of annealing the substrate so that an electrical contact is formed between the electrodes and the silicon p-n junction.

In some embodiments, the device is exposed to radiation with energy sufficient to generate electron pairs within the silicon during one or more of the annealing steps. This may facilitate, for example, control of the charge state of hydrogen atoms in the device.

The amount of hydrogen atoms in a given charge state may be controlled by varying one or more parameters of the radiation during exposure. The temperature of the substrate during exposure to the electromagnetic radiation may be between 150° C. and 250° C. The substrate may be exposed to electromagnetic radiation for 10 seconds to 20 minutes.

Generally, the performance of the photovoltaic device deteriorates after the devices are deployed due to CID. In some instances, the loss in performance is partially recovered after several hundreds of hours of exposure of the device to high temperatures and radiation. This can equate to 5 to 20 years in the field depending on location.

Embodiments of the methods described herein, allow keeping stable performance throughout the operational life of the devices. For example, in devices treated with the methods disclosed herein the open circuit voltage may decrease less than 1% relative and the efficiency less than 5% relative.

In embodiments, the second period of time is between 10 seconds and 5 minutes and the further period of time is between 10 seconds and 20 minutes.

In some embodiments, the method comprises the step of providing the source of hydrogen atoms in the photovoltaic device. The source of hydrogen may be provided in a layer of the photovoltaic device and diffuse through other areas of the device during annealing, or the source of hydrogen may be provided in the annealing atmosphere.

In accordance with the fifth aspect, the present invention provides a silicon photovoltaic device manufactured in accordance with the method of any one of the aspects above.

In accordance with the sixth aspect, the present invention provides a method for stabilising the performance of a silicon screen printed photovoltaic device, the method comprising the steps of:

providing a silicon screen printed photovoltaic device;

annealing the screen printed photovoltaic device at a temperature between 500° C. and 700° C. for a predetermined period of time; and exposing the device to electromagnetic radiation while the device is kept at a temperature between 150° C. and 400° C. in a manner such that photons with an energy higher than that of a bandgap of silicon material provide a radiation intensity of at least 20 mW/cm² and an excess of minority carriers is created in the silicon material;

wherein, during the steps of annealing the device and exposing the device to electromagnetic radiation, electrically active defects in the silicon material are passivated.

Advantageous embodiments of the methods disclosed herein provide a series of manufacturing conditions which allow to mitigate the effect of CID on the performance of photovoltaic devices. A combined approach that involves tailored annealing temperatures, including firing temperatures, and exposure to radiation is used to reduce the loss of performance of the photovoltaic devices due to CID. In addition, embodiments allow stabilizing the performance of industrially-produced HP mc-Si PERC cells that have been fired at CID-activating temperatures (~740-800° C.), which is the industrial standard for silver contact formation.

BRIEF DESCRIPTION OF THE DRAWINGS

Features and advantages of the present invention will become apparent from the following description of embodiments thereof, by way of example only, with reference to the accompanying drawings in which.

DETAILED DESCRIPTION OF EMBODIMENTS

Embodiments of the present invention generally relate to methods for manufacturing photovoltaic devices and methods for stabilising the performance of photovoltaic devices.

In the methods described herein, multiple annealing treatments are used in specific order, in conjunction with exposure to radiation, to minimise the effect of CID on the performance of photovoltaic devices. The combined approach disclosed herein provides better stabilised performance over methods that use either heat treatments or radiation treatments.

Figure 1:
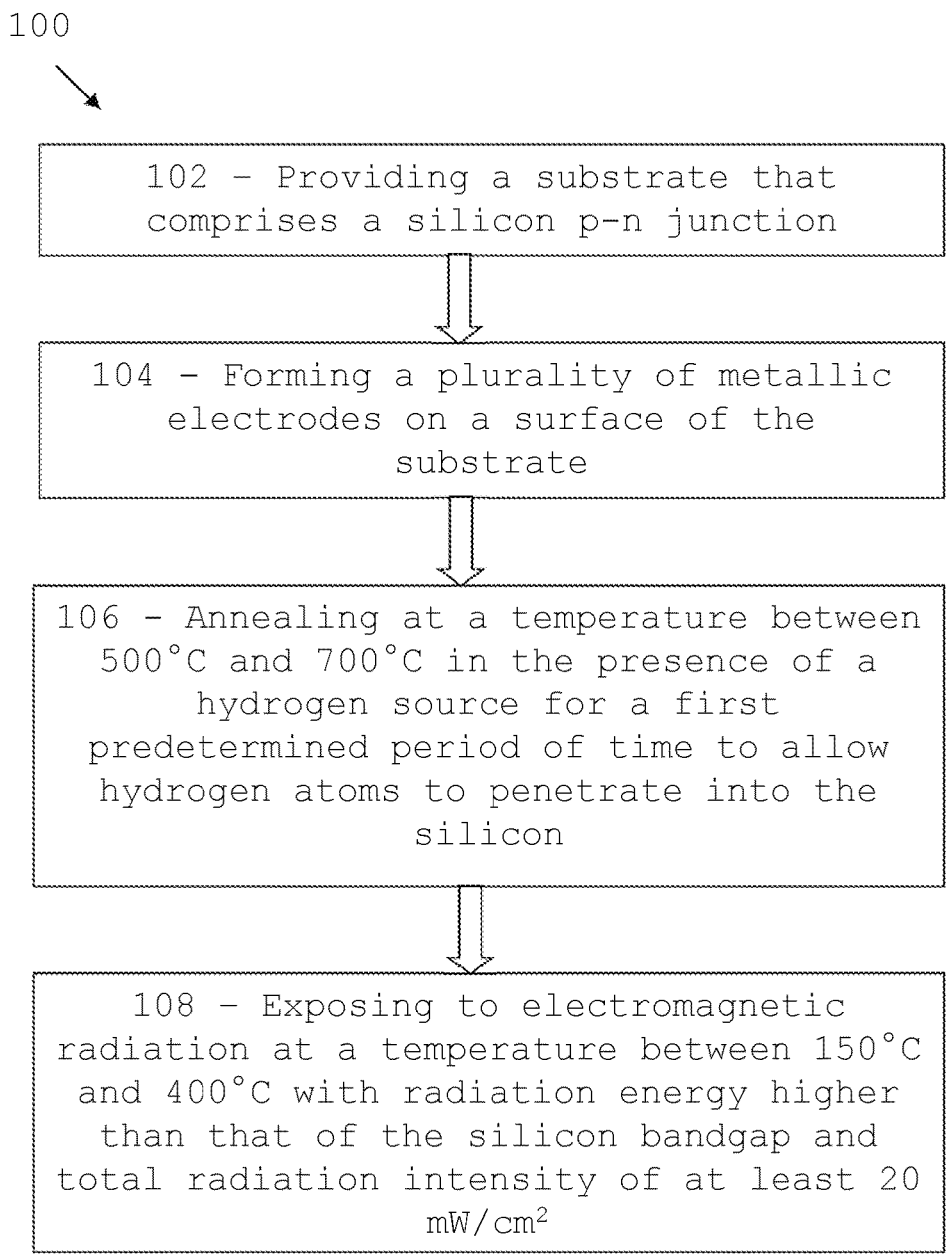
FIGS. 1 to 4 show flow diagrams outlining steps for manufacturing a photovoltaic device in accordance with embodiments.

Referring now to FIG. 1, there is shown a flow diagram 100 with a series of method steps required to manufacture a photovoltaic device in accordance with embodiments. The photovoltaic device can be any type of solar cell device for example: a screen printed solar cell, non-screen printed solar cell, PERC cell or plated solar cell where the substrate can be a p-type, n-type, mono- or multi-crystalline silicon substrate. After providing a substrate comprising of a silicon p-n junction at step 102, metallic electrodes are formed on the surface of the substrate at step 104. This step is optional and may be performed at a later stage, for example after the annealing step (106) or after radiation exposure (step 108).

At step 106, the structure comprising the substrate and the metallic electrodes undergoes annealing at a moderate temperature, between 500° C. to 700° C., in the presence of a hydrogen source for a first predetermined period of time to allow hydrogen atoms to penetrate into the silicon. The hydrogen source can be provided in one or more layers of the structure, or through an external hydrogen source.

In the case of screen printed cells, the step of annealing the structure is performed so that an electrical contact is formed between the electrodes and the silicon p-n junction. This process is generally known as firing. In the method disclosed herein, the highest temperature used during this step is lower than the highest temperature commonly used by the manufacturers for 'firing'. This lower firing temperature allows a reduction of the effect of CID on the device performance.

At step 108, the above annealed structure undergoes exposure to electromagnetic radiation. The temperature of the structure throughout this step is maintained between 150° C.-400° C. The radiation contains energy higher than 20 mW/cm$^2$ at wavelengths that can be absorbed by silicon material. The high intensity of the radiation allows heating of the silicon material and is absorbed by the silicon. Therefore, the radiation creates an excess of minority carriers in the silicon. Heating could be provided by another source, in addition to light, in particular for the lower illumination intensities.

As a result of the combined effect of annealing the structure at moderate temperatures, at step 106, and exposing the structure to electromagnetic radiation, at step 108, electrically active defects are rapidly formed and then passivated. This helps in mitigating subsequent CID in solar cells.

Figure 2:
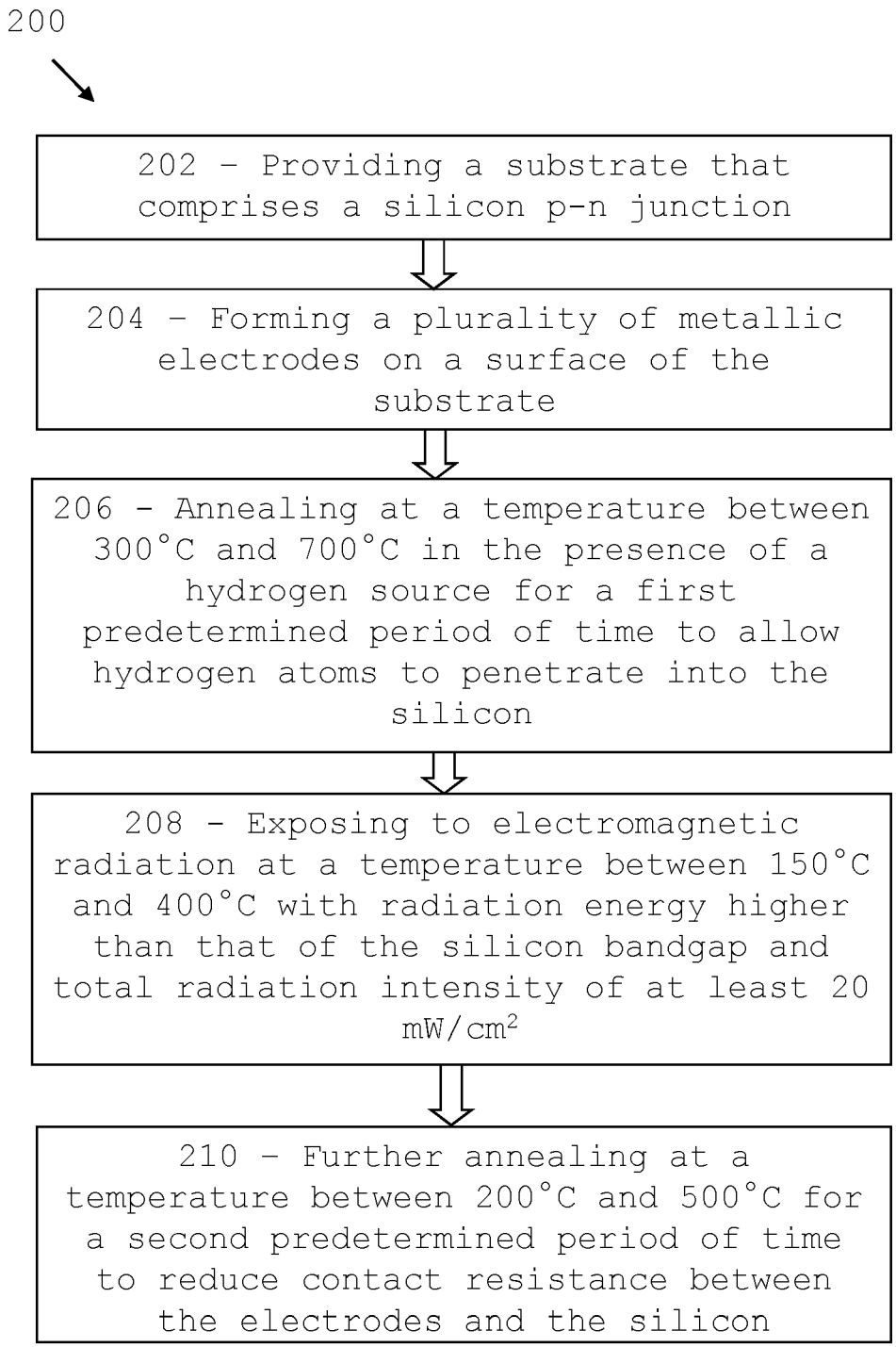

Referring now to FIG. 2, there is shown a flow diagram 200 with steps required to manufacture a photovoltaic device. The process followed in diagram 200 is similar to the process described in FIG. 1.

One of the differences between diagram 100 and diagram 200 are at:
step 206, where a broader temperature range may be used (300° C. to 700° C.); and
step 210 where an additional annealing is introduced.

The additional annealing step 210 allows reducing the contact resistance between the electrodes and the silicon substrate and is performed at a temperature between 200° C. and 500° C.

Figure 3:
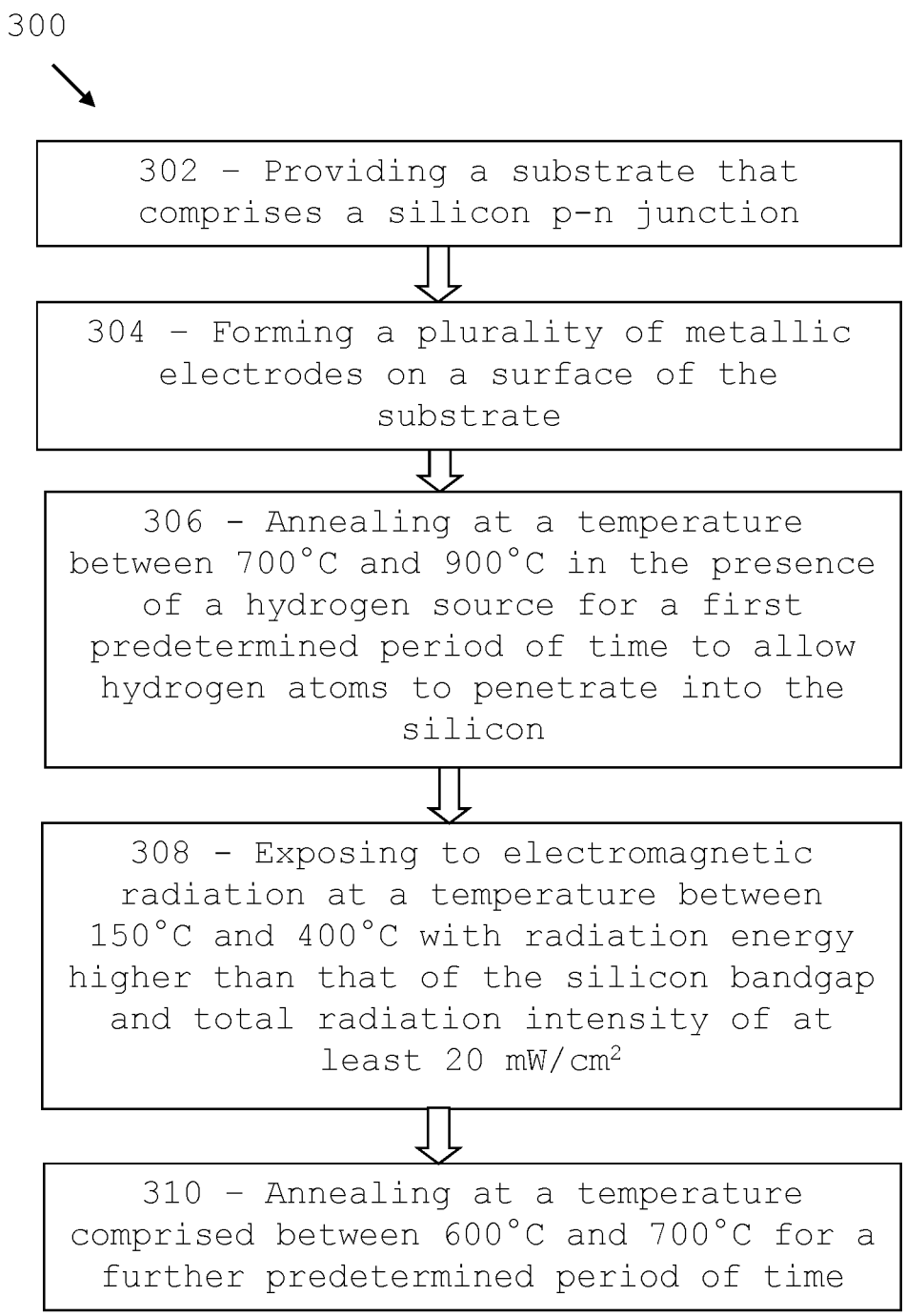

Referring now to FIG. 3, there is shown a further manufacturing method 300 which involves a high temperature annealing step 306. At step 306 the structure is annealed at a temperature between 700° C. and 900° C. for a very short period of time. For screen printed solar cells, this annealing step can be used to fire the metal contacts and has a duration in the order of a few seconds. At step 308, a further annealing is performed at a lower temperature between 600° C. and 700° C. for a period of time similar to the first annealing step. In the instance of fabrication of screen-printed cells, step 308 is a 'refiring' step. In some instances, steps 306 and 308 may be performed as a single annealing process with a specific temperature profile (high temperature for firing, lower temperature for refiring).

At step 310, the structure is exposed to electromagnetic radiation at a temperature is kept between 150° C. and 400° C. to facilitate passivation of defects by controlling the charge state of hydrogen atoms in the device. During step 310 excess carriers are created in the silicon.

Figure 4:
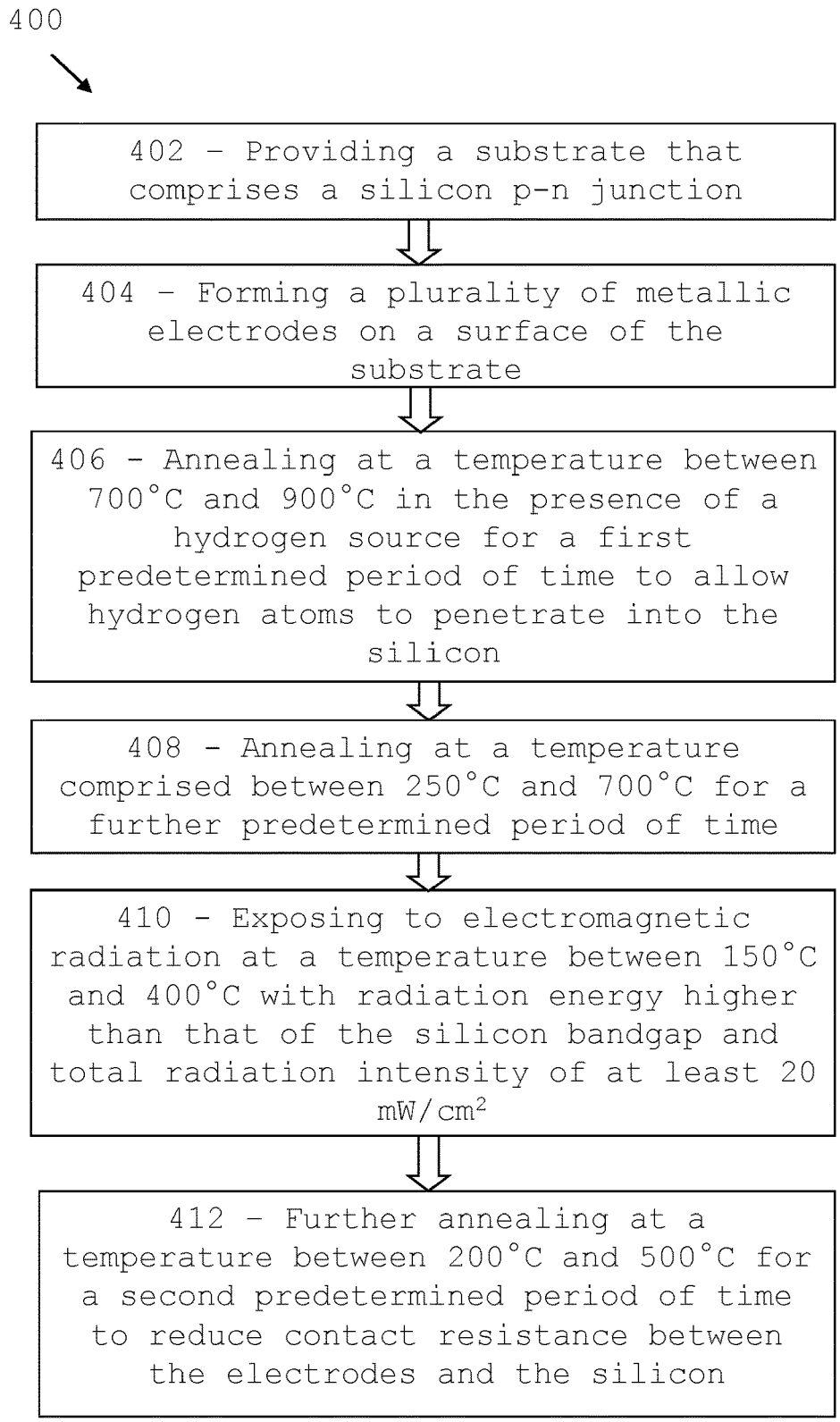

Referring now to FIG. 4, there is shown a further flow diagram 400 with steps required to manufacture a photovoltaic device using a similar process as shown in diagram 300. One of the differences between process 300 and process 400 is that at step 408, a broader range of temperatures, 250° C. to 700° C., may be used for annealing. Furthermore, an additional annealing step, 412, is introduced. The additional annealing step allows a reduction in the contact resistance between the electrodes and the silicon substrate and is performed at a temperature between 200° C. and 500° C.

Figure 5:
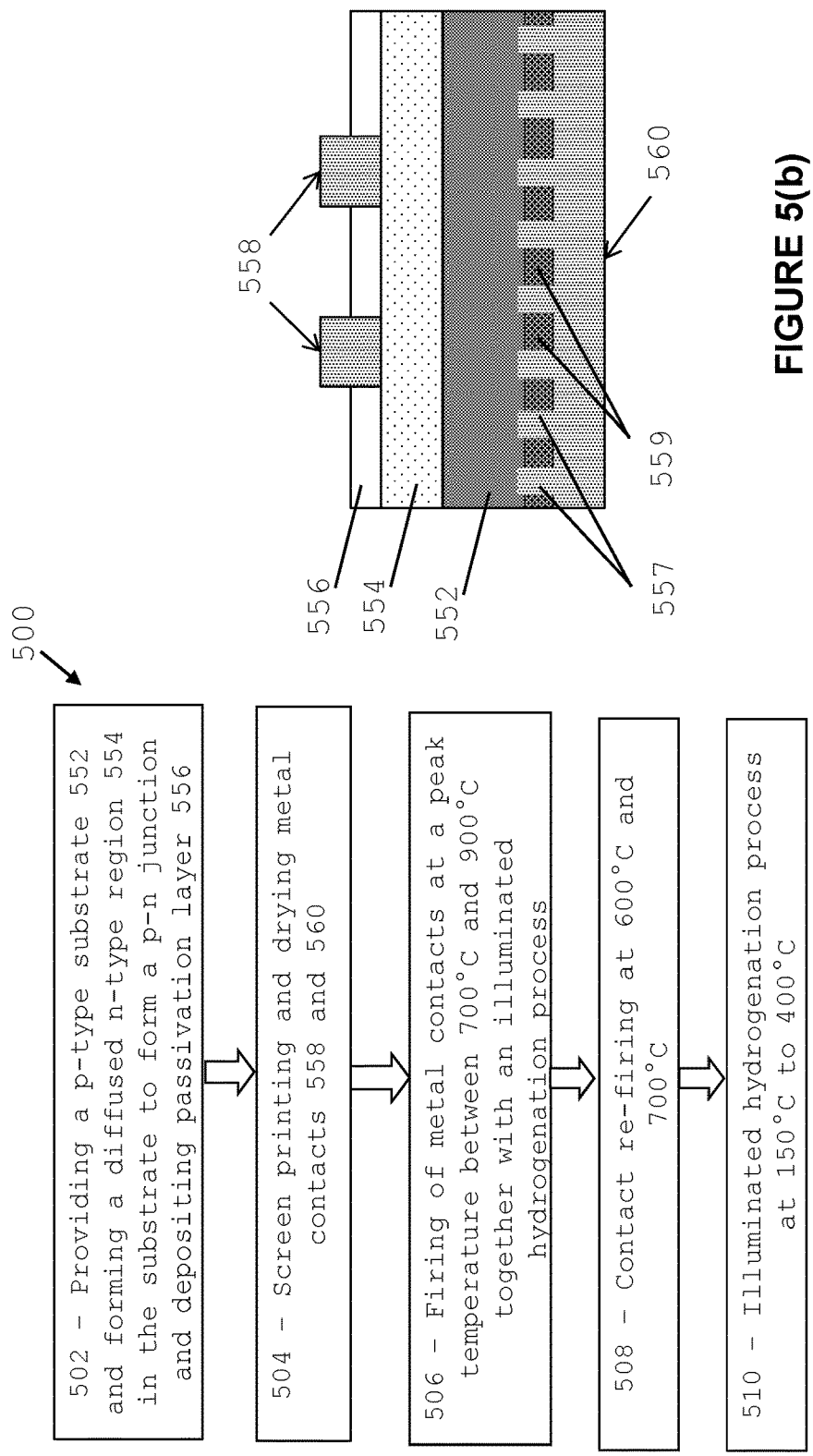
FIG. 5 shows a flow diagram outlining the steps for manufacturing a mc-Si PERC solar cell using a method in accordance with embodiments and a schematic diagram of a mc-Si PERC solar cell.

Referring now to FIG. 5, there is shown a flow diagram 500 outlining steps for manufacturing a screen printed PERC solar cell in accordance with embodiments (a) and a schematic representation of a PERC solar cell (b).

At step 502 a textured p-type multi-crystalline silicon substrate 552 is provided. Subsequently, a phosphorus diffusion is used to form heavily phosphorus doped regions 554 near the silicon surfaces.

A dielectric layer 556 containing hydrogen, such as silicon nitride, is deposited onto the light-receiving surface of the device, for example by using PECVD. Dielectric layers 557 are also formed on the rear surface. These may consist of a thin layer of aluminium oxide, formed by techniques such as atomic layer deposition or PECVD, and a capping hydrogen-containing dielectric layer of silicon nitride, silicon oxide, silicon oxy-nitride or silicon carbide.

A laser process is used to define contact openings 559 and locally open dielectric layers 557 on the rear surface of the device.

At step 504, a metal containing layer 560 is deposited onto the rear surface of the device, for example, by screen printing aluminium. Metal contacts 558 are also formed on regions 556, for example by screen printing silver.

At step 506, the structure is heated to a temperature between 700° C. and 900° C. to fire the metal contacts. This may happen in conjunction with exposure of the structure to radiation. Step 506 allows hydrogen atoms to penetrate into the silicon.

At step 508, a refiring is performed at a temperature between 600° C. and 700° C.

At step 510, the structure is exposed to electromagnetic radiation at a temperature between 150° C. and 400° C. The radiation contains energy higher than 20 mW/cm$^2$ at wavelengths that can be absorbed by silicon material. Heating could be provided by the absorbed radiation or by another source, in addition to the radiation, in particular for the lower illumination intensities.

Figure 6:
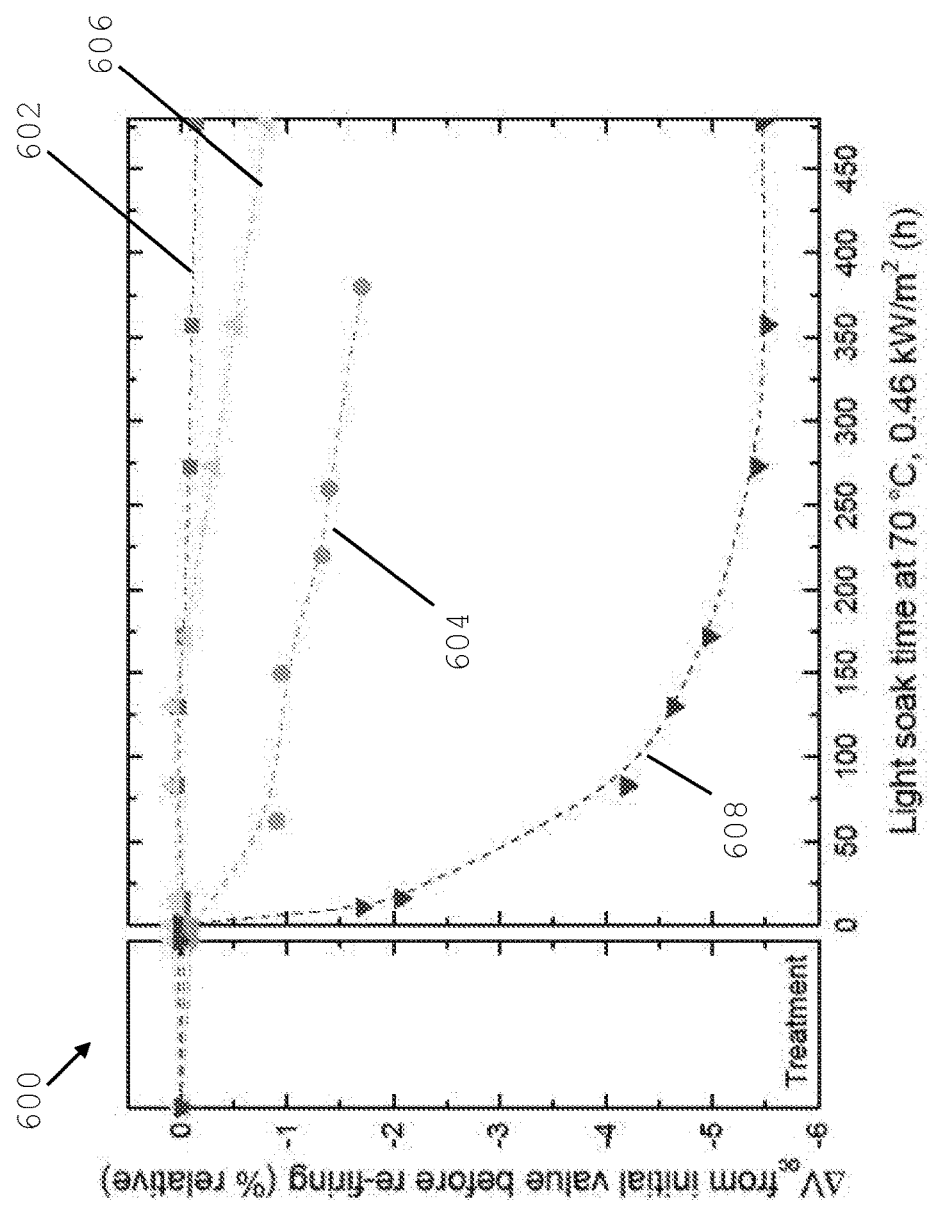
FIG. 6 shows a plot with the evolution of the open circuit voltage for mc-Si PERC manufactured using a method in accordance with embodiments.
Figure 7:
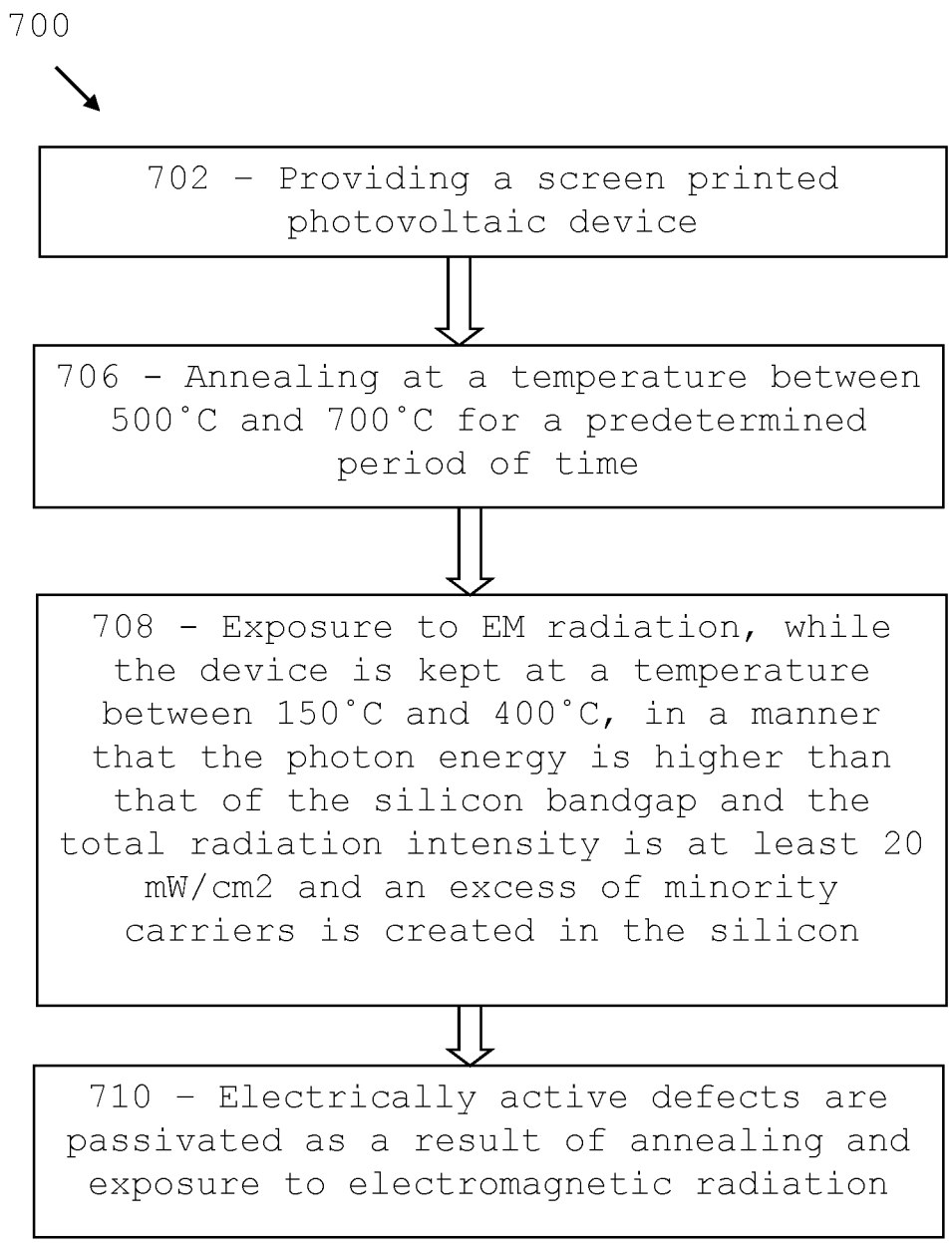
FIG. 7 shows a flow diagram outlining steps for stabilising the performance of a screen-printed photovoltaic device in accordance with embodiments.

Referring now to FIG. 6, there is shown a plot 600 with the evolution of the open circuit voltage for standard mc-Si PERC cells which were treated using method 700 outlined in FIG. 7.

Metallized mc-Si PERC solar cells were re-fired at 565° C. peak firing temperature. The Applicants found that this temperature lead to significantly enhanced stability without a significant loss in $V_{oc}$ after refiring, which was observed at other temperatures.

Four different conditions were tested and respective curves are shown in plot 600:
Refiring at 565° C. followed by laser radiation exposure at 200° C. for 15 mins, trace 602;
Refiring at 565° C. without radiation exposure, trace 604;
Laser radiation exposure at 200° C. for 15 mins without refiring, trace 606; and
No processing.

Cells were then light soaked at 70° C. with a broadband halogen source emitting total irradiance of approximately 0.46 kW/m² at the sample level. $V_{oc}$ measurements were taken using Suns-$V_{oc}$ at each stage of processing and at intermittent stages during the light soak. Full I-V data was taken on initial cells, after firing and/or laser stabilization, and after 480 hours of light soaking.

Plot 600 shows that there was little to no degradation in $V_{oc}$ observed with the combined re-fire and additional laser stabilization step (602) after 480 hours of light soaking (−0.1% relative compared to initial value before processing), compared to a 5.5% relative loss for the control sample. This is a significantly improved result in relation to solar cells which were only treated using refiring at 565° C. without radiation exposure, trace 604, and cells that were only treated using laser radiation exposure at 200° C., trace 606.

The Applicants found that CID susceptibility in mc-Si is strongly related to peak firing temperatures. Temperatures above approximately 675° C. were found to trigger significant subsequent degradation under illumination. Screen-printed cells typically require a peak firing temperature of approximately 800° C. for the formation of the front Ag contacts. This is likely a key contributing factor to the widely-reported CID effect observed on these devices. The methods described herein allow reducing substantially the effect of CID on performance as shown in plot 600 and table 2. The values in brackets are the relative percentages after the devices are processed and the non-bracketed values are relative percentages after light-soaking.

TABLE 2

|  | Control | Laser only | Fire and laser |
|---|---|---|---|
| $\Delta V_{oc}$ % rel | (0.0), −5.6 | (0.0), −1.0 | (0.0), −0.1 |
| $\Delta J_{sc}$ % rel | (−0.2), −7.0 | (−0.2), −1.9 | (−0.2), −1.0 |
| $\Delta FF$ % rel | (−0.2), −0.6 | (0.1), −0.8 | (−3.4), −3.3 |
| $\Delta\eta$ % rel | (−0.3), −12.7 | (−0.1), −3.7 | (−3.8), −4.6 |

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The claims as defined in the invention are as follow:

1. A method for manufacturing a photovoltaic device, the method comprising the steps of:
   providing a substrate that comprises a silicon p-n junction;
   annealing the substrate at a temperature between 500° C. and 700° C. in the presence of a hydrogen source for a first predetermined period of time to allow hydrogen atoms to penetrate into silicon material of the silicon p-n junction; and
   exposing the substrate to electromagnetic radiation while the substrate is kept at a temperature between 150° C. and 400° C. in a manner such that photons with an energy higher than that of a bandgap of the silicon material are provided at a radiation intensity of at least 20 mW/cm² and an excess of minority carriers is created in the silicon material;
   wherein, during the steps of annealing the substrate and exposing the substrate to electromagnetic radiation, electrically active defects in the silicon material are passivated.

2. The method of claim 1 wherein the first period of time is between 1 second and 5 minutes.

3. The method of claim 1 wherein the method further comprises the step of forming a plurality of metallic electrodes on a surface of the substrate and the step of annealing the substrate is performed in a manner such that an electrical contact is formed between the electrodes and the silicon p-n junction.

4. The method of claim 1 wherein the method further comprises exposing the substrate to electromagnetic radiation with an energy sufficient to generate electron pairs within the silicon during the step of annealing the substrate for a first predetermined period of time or during the step of annealing the substrate for a further predetermined period of time.

5. The method of claim 1 wherein the open circuit voltage of the photovoltaic device decreases less than 1% relative while the photovoltaic device is exposed to 0.5 sun illumination for 500 hours at 70° C.

6. The method of claim 1 wherein the conversion efficiency of the photovoltaic device decreases less than 5% relative while the photovoltaic device is exposed to 0.5 sun illumination for 500 hours at 70° C.

7. The method of claim 1 wherein the method further comprises the step of varying at least one parameter of the radiation during exposure to control the amount of hydrogen atoms in a given charge state.

8. The method of claim 1 wherein the temperature of the substrate during exposure to electromagnetic radiation is between 150° C. and 250° C.

9. The method of claim 1 wherein the duration of the step of exposing the substrate to electromagnetic radiation is between 10 seconds and 20 minutes.

10. A silicon photovoltaic device manufactured in accordance with claim 1.

11. A method for manufacturing a photovoltaic device, the method comprising the steps of:
    providing a substrate that comprises a silicon p-n junction;
    annealing the substrate at a temperature between 300° C. and 700° C. in the presence of a hydrogen source for a first predetermined period of time to allow hydrogen atoms to penetrate into silicon material of the p-n junction;
    exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm² and an excess of minority carriers is created in the silicon material; and
    further annealing the substrate at a temperature between 200° C. and 500° C. for a second predetermined period of time to reduce contact resistance between the metallic electrodes and the silicon material;
    wherein, during the steps of annealing the substrate and exposing the substrate to electromagnetic radiation, electrically active defects in the silicon material are passivated.

12. The method of claim 11 wherein the second period of time is between 1 minute and 5 minutes.

13. A method for manufacturing a photovoltaic device, the method comprising the steps of:

providing a substrate that comprises a silicon p-n junction;

annealing the substrate at a temperature between 700° C. and 900° C. in the presence of a hydrogen source for a first predetermined period of time to allow hydrogen atoms to penetrate into silicon material of the silicon p-n junction;

annealing the substrate at a temperature between 600° C. and 700° C. for a further predetermined period of time; and exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm$^2$ and an excess of minority carriers is created in the silicon material;

wherein, during the steps of annealing the substrate and exposing the substrate to electromagnetic radiation, electrically active defects in the silicon material are passivated.

14. The method of claim 13 wherein the first period of time is between 1 second and 5 seconds.

15. The method of claim 13 wherein the further period of time is between 10 minutes and 20 minutes.

16. The method of claim 13 wherein the method further comprises the step of providing the source of hydrogen atoms in the photovoltaic device.

17. A silicon screen printed solar cell manufactured in accordance with the method of claim 13.

18. A method for manufacturing a photovoltaic device, the method comprising the steps of:

providing a substrate that comprises a silicon p-n junction;

annealing the substrate at a temperature between 700° C. and 900° C. in the presence of a hydrogen source for a first predetermined period of time to allow hydrogen atoms to penetrate into silicon material of the p-n junction;

annealing the substrate at a temperature between 250° C. and 700° C. for a further predetermined period of time; and exposing the substrate to electromagnetic radiation while the substrate is kept at a temperature between 150° C. and 400° C. in a manner such that photons with an energy higher than that of a bandgap of the silicon are provided at a radiation intensity of at least 20 mW/cm$^2$ and an excess of minority carriers is created in the silicon material;

further annealing the substrate at a temperature between 200° C. and 500° C. for a second predetermined period of time to reduce contact resistance between the metallic electrodes and the silicon material;

wherein, during the steps of annealing the substrate and exposing the substrate to electromagnetic radiation, electrically active defects in the silicon material are passivated.

19. A method for stabilising the performance of a silicon screen printed photovoltaic device, the method comprising the steps of:

providing a silicon screen printed photovoltaic device;

annealing the screen printed photovoltaic device at a temperature between 500° C. and 700° C. for a predetermined period of time; and exposing the device to electromagnetic radiation while the device is kept at a temperature between 150° C. and 400° C. in a manner such that photons with an energy higher than that of a bandgap of silicon material provide a radiation intensity of at least 20 mW/cm$^2$ and an excess of minority carriers is created in the silicon material;

wherein, during the steps of annealing the device and exposing the device to electromagnetic radiation, electrically active defects in the silicon material are passivated.

20. The method of claim 19 wherein the method further comprises the step of annealing the substrate at a temperature between 200° C. and 500° C. for a second predetermined period of time to reduce contact resistance.

* * * * *